United States Patent
Sunwoo et al.

(10) Patent No.: US 11,664,827 B2
(45) Date of Patent: May 30, 2023

(54) APPARATUS AND METHOD FOR SUCCESSIVE CANCELLATION BIT-FLIP DECODING OF POLAR CODE

(71) Applicant: AJOU UNIVERSITY INDUSTRY-ACADEMIC COOPERATION FOUNDATION, Suwon-si (KR)

(72) Inventors: Myung Hoon Sunwoo, Seoul (KR); U Seok Lee, Suwon-si (KR)

(73) Assignee: AJOU UNIVERSITY INDUSTRY—ACADEMIC COOPERATION FOUNDATION, Suwon-si (KR)

( * ) Notice: Subject to any disclaimer, the term of this patent is extended or adjusted under 35 U.S.C. 154(b) by 0 days.

(21) Appl. No.: 17/530,999

(22) Filed: Nov. 19, 2021

(65) Prior Publication Data

US 2022/0255565 A1   Aug. 11, 2022

(30) Foreign Application Priority Data

Feb. 9, 2021  (KR) .......................... 10-2021-0018071

(51) Int. Cl.
*H03M 13/37*  (2006.01)
*H03M 13/45*  (2006.01)
*H03M 13/13*  (2006.01)

(52) U.S. Cl.
CPC ....... *H03M 13/3753* (2013.01); *H03M 13/13* (2013.01); *H03M 13/45* (2013.01)

(58) Field of Classification Search
CPC ... H03M 13/3753; H03M 13/13; H03M 13/45
See application file for complete search history.

(56) References Cited

U.S. PATENT DOCUMENTS

| | | | |
|---|---|---|---|
| 2021/0099188 A1* | 4/2021 | Ghaddar | H03M 13/6572 |
| 2022/0149868 A1* | 5/2022 | Wang | H03M 13/3933 |
| 2022/0206746 A1* | 6/2022 | Kamiya | G06F 7/24 |

FOREIGN PATENT DOCUMENTS

KR    10-1817168 B1   1/2018

\* cited by examiner

*Primary Examiner* — Thien Nguyen
(74) *Attorney, Agent, or Firm* — Sughrue Mion, PLLC

(57) ABSTRACT

A polar code decoding apparatus according to an embodiment includes a divider configured to generate a decoding tree in which a plurality of nodes including one or more critical sets for a polar-encoded codeword are formed in a hierarchical structure, and divide the decoding tree into one or more partitions, each partition equally including lowest nodes of the decoding tree, a determiner configured to determine a memory size for storing a primary decoding result based on a specific partition, the specific partition being selected from among the one or more partitions based on the number of critical sets included in each partition, and a decoder configured to decode the codeword primarily by using a successive cancellation (SC) decoding technique.

16 Claims, 7 Drawing Sheets

APPARATUS AND METHOD FOR SUCCESSIVE CANCELLATION BIT-FLIP DECODING OF POLAR CODE

CROSS-REFERENCE TO RELATED APPLICATION(S)

This application claims the benefit under 35 USC § 119(a) of Korean Patent Application No. 10-2021-0018071, filed on Feb. 9, 2021, in the Korean Intellectual Property Office, the entire disclosure of which is incorporated herein by reference for all purposes.

BACKGROUND

1. Field

The following description relates to a technology for decoding a polar code.

2. Description of Related Art

A polar code is the first code to achieve the channel capacity. The polar code is gaining great attention in the communication field, such as being employed as a 5G control code, due to its excellent error correction capability. In this regard, research on a decoding method for a polar code is also being actively conducted.

Among them, there is a successive cancellation (SC) algorithm as a basic decoding method for a polar code. However, the successive cancellation algorithm has a limitation in that, as compared to the low density parity check (LDPC) code or turbo code of similar code lengths, error-correcting performance is not excellent.

In order to overcome the aforementioned limitation, as a new decoding method for a polar code, SC-Flip (a successive cancellation flip; SCF) algorithm with improved error correction performance has been announced. The SC-Flip algorithm uses a cyclic redundancy check (CRC) as an outer code. Then, when an error is detected, a bit with the smallest log likelihood ratio (LLR) value is found, the bit is bit-flipped, and a decoding process is performed again from the bit.

Specifically, a decoding process of the SC-Flip algorithm is as follows. A decoding device primarily performs the SC decoding process on all bits. When the SC decoding process is completed, CRC detection is performed. However, when the detection fails, the bit at the position with the smallest log likelihood ratio value is found, and the bit is flipped. Then, the decoding process is performed again from the bit. When the decoding device fails to detect the CRC again in spite of performing the decoding process again as described above, a bit position with the next smallest log likelihood ratio value is found, the bit at the bit position is flipped, and the decoding process is repeated.

Unlike the SC decoding-based decoding device, which sequentially performs decoding bit by bit and does not recurse to the already decoded bits, the SC-Flip-based decoding device primarily performs the SC decoding process, and then returns to the bit with the smallest log likelihood ratio and performs re-decoding.

That is, since the SC-Flip-based decoding device performs re-decoding by recursively using the already decoded bit, the SC-Flip-based decoding device requires more processes for storing the primary decoding result and accessing the stored primary decoding result, in contrast to the SC decoding device.

Examples of the related art include Korean Patent Registration No. 10-1817168 (registered on Jan. 4, 2018).

SUMMARY

Disclosed embodiments are to provide an apparatus and method for decoding a polar code.

In one general aspect, there is provided a method of decoding a polar code, including: generating a decoding tree in which a plurality of nodes including one or more critical sets for a polar-encoded codeword are formed in a hierarchical structure; dividing the decoding tree into one or more partitions, each partition equally including lowest nodes of the decoding tree; determining a memory size for storing a primary decoding result based on a specific partition, the specific partition being selected from among the one or more partitions based on the number of critical sets included in each partition; and decoding the codeword primarily by using a successive cancellation (SC) decoding technique, in which the decoding includes storing at least one of first information corresponding to a first bit of the critical sets and second information corresponding to a second bit of the critical sets in nodes of each of stages of a memory for storing the primary decoding result, as information for re-decoding, and in the decoding, a bit with a lowest log likelihood ratio (LLR) value in the codeword is flipped based on the information for re-decoding and re-decoding is performed from the bit with the lowest log likelihood ratio value, when a cyclic redundancy check (CRC) detection fails.

The determining of the memory size may include selecting, from among the one or more partitions, a partition including most critical sets as the specific partition.

The determining of the memory size may include determining the memory size for storing the primary decoding result based on the number of critical sets included in the specific partition.

The first information may be state information about each of stages of the memory for performing successive cancellation decoding when the first bit is re-decoded, and the second information may be state information about each of the stages of the memory for performing the successive cancellation decoding when the second bit is re-decoded.

The decoding may include storing the first information in a first node of each of the stages of the memory for storing the primary decoding result and storing the second information in a second node of each of the stages of the memory for storing the primary decoding result based on a result of performing a shift operation on each of the first bit and the second bit.

The decoding may include storing the second information in the second node when a result of a first shift operation on the first bit is different from a result of a second shift operation on the second bit.

The first shift operation may be an operation of performing a right shift by as much as the stage of the memory for storing the primary decoding result in which the first information is to be stored, and the second shift operation may be an operation for performing a right shift by as much as the stage of the memory storing the primary decoding result in which the second information is to be stored.

The decoding may include storing an accumulated value of the result of the first shift operation as the first information in the first node and an accumulated value of the result of the second shift operation as the second information in the second node, based on the result of the first shift operation and the result of the second shift operation.

The decoding may include storing the accumulated value of the result of the first shift operation and the accumulated value of the result of the second shift operation by adding, to the first node and the second node, respectively, a preset first value when the result of the first shift operation and the result of the second shift operation are the same, and a preset second value when the result of the first shift operation and the result of the second shift operation are different.

In another general aspect, there is provided a polar code decoding apparatus including: a divider configured to generate a decoding tree in which a plurality of nodes including one or more critical sets for a polar-encoded codeword are formed in a hierarchical structure, and divide the decoding tree into one or more partitions, each partition equally including lowest nodes of the decoding tree; a determiner configured to determine a memory size for storing a primary decoding result based on a specific partition, the specific partition being selected from among the one or more partitions based on the number of critical sets included in each partition; and a decoder configured to decode the codeword primarily by using a successive cancellation (SC) decoding technique, in which the decoder stores at least one of first information corresponding to a first bit of the critical sets and second information corresponding to a second bit of the critical sets in nodes of each of stages of a memory for storing the primary decoding result, as information for re-decoding, and a bit with a lowest log likelihood ratio (LLR) value in the codeword is flipped based on the information for re-decoding and re-decoding is performed from the bit with the lowest log likelihood ratio value, when the decoder fails a cyclic redundancy check (CRC) detection in the decoding.

The determiner may select, from among the one or more partitions, a partition including most critical sets as the specific partition.

The determiner may determine the memory size for storing the primary decoding result based on the number of critical sets included in the specific partition.

The first information may be state information about each of stages of the memory for performing successive cancellation decoding when the first bit is re-decoded, and the second information may be state information about each of the stages of the memory for performing the successive cancellation decoding when the second bit is re-decoded.

The decoder may store the first information in a first node of each of the stages of the memory for storing the primary decoding result and store the second information in a second node of each of the stages of the memory for storing the primary decoding result based on a result of performing a shift operation on each of the first bit and the second bit.

The decoder may store the second information in the second node when a result of a first shift operation on the first bit is different from a result of a second shift operation on the second bit.

The first shift operation may be an operation of performing a right shift as much as the stage of the memory for storing the primary decoding result in which the first information is to be stored, and the second shift operation may be an operation for performing a right shift by as much as the stage of the memory storing the primary decoding result in which the second information is to be stored.

The decoder may store an accumulated value of the result of the first shift operation as the first information in the first node and an accumulated value of the result of the second shift operation as the second information in the second node, based on the result of the first shift operation and the result of the second shift operation.

The decoder may store the accumulated value of the result of the first shift operation and the accumulated value of the result of the second shift operation by adding, to the first node and the second node, respectively, a preset first value when the result of the first shift operation and the result of the second shift operation are the same, and a preset second value when the result of the first shift operation and the result of the second shift operation are different.

DETAILED DESCRIPTION

Hereinafter, specific embodiments of an embodiment will be described with reference to the accompanying drawings. The following detailed description is provided to assist in a comprehensive understanding of the methods, devices and/or systems described herein. However, the detailed description is only for illustrative purposes and the present disclosure is not limited thereto.

In describing the embodiments, when it is determined that detailed descriptions of known technology related to the present disclosure may unnecessarily obscure the gist of the present disclosure, the detailed descriptions thereof will be omitted. The terms used below are defined in consideration of functions in the present disclosure, but may be changed depending on the customary practice or the intention of a user or operator. Thus, the definitions should be determined based on the overall content of the present specification. The terms used herein are only for describing the embodiments, and should not be construed as limitative. Unless expressly used otherwise, a singular form includes a plural form. In the present description, the terms "including", "comprising", "having", and the like are used to indicate certain characteristics, numbers, steps, operations, elements, and a portion or combination thereof, but should not be interpreted to preclude one or more other characteristics, numbers, steps, operations, elements, and a portion or combination thereof.

Figure 1:
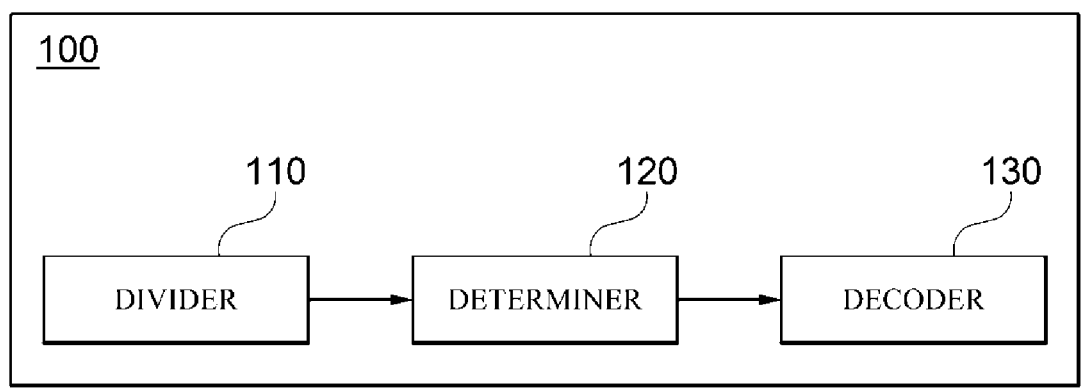
FIG. 1 is a block diagram for describing a polar code decoding apparatus according to an embodiment.

FIG. 1 is a block diagram for describing a polar code decoding apparatus 100 according to an embodiment.

Referring to FIG. 1, the polar code decoding apparatus 100 according to an embodiment includes a divider 110, a determiner 120, and a decoder 130.

In the following embodiment, each component may have different functions and capabilities in addition to those described below, and additional components may be included in addition to those not described below.

In addition, in the following embodiment, the divider 110, the determiner 120, and the decoder 130 may be implemented by using one or more physically separated devices, or may be implemented by one or more processors or a combination of one or more processors and software, and may not be clearly distinguished in specific operations, unlike the illustrated example.

The divider 110 according to an embodiment may receive a polar-encoded codeword and a codeword length to generate a decoding tree that satisfies the received codeword and codeword length, and may divide the generated decoding tree into one or more partitions based on a critical set for the codeword.

That is, the divider 110 generates a decoding tree in which a plurality of nodes including one or more critical sets for the polar-encoded codeword are formed in a hierarchical structure, and divides the decoding tree into one or more partitions, each partition equally including lowest nodes of the decoding tree. Meanwhile, in this case, the lowest node may refer to the received codeword.

Figure 2:
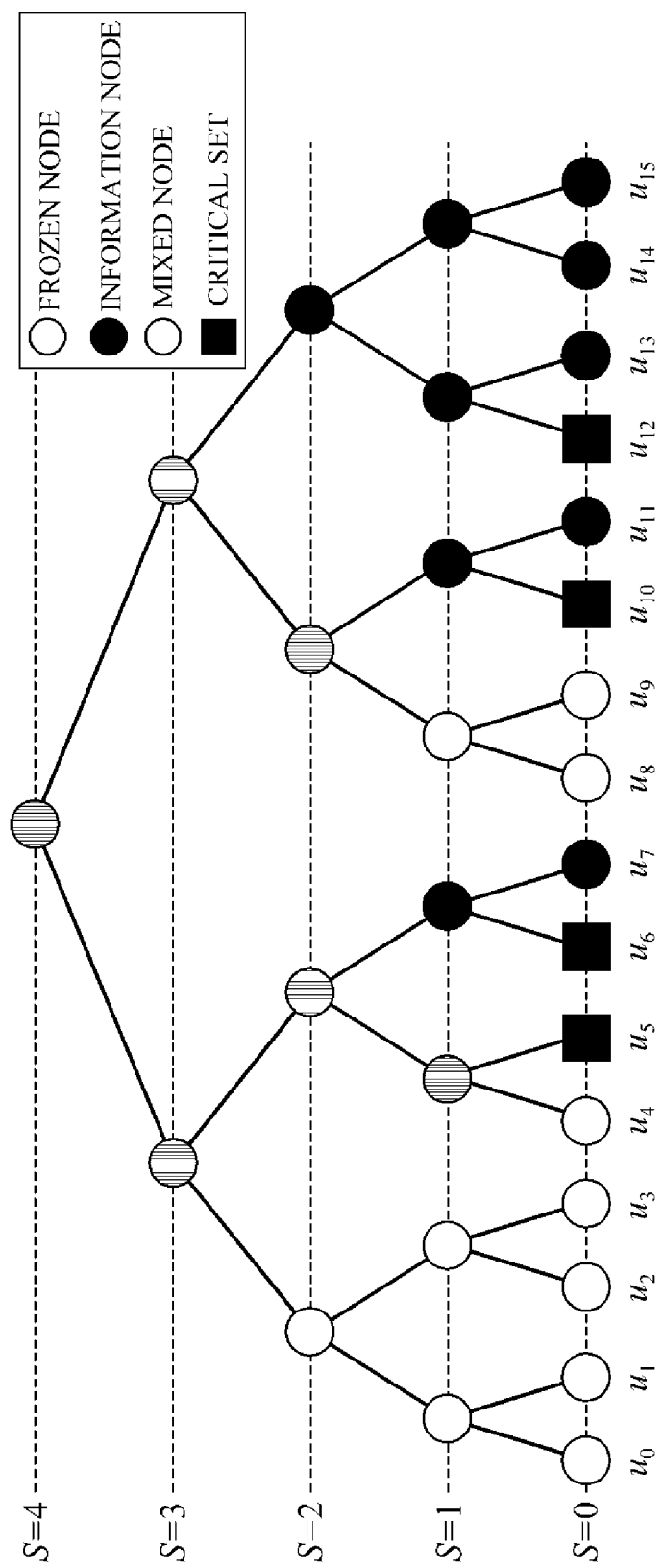
FIG. 2 is a diagram for describing a process in which a divider divides a decoding tree into one partition according to an embodiment.

FIG. 2 is a diagram for describing a process in which the divider 110 divides the decoding tree into one partition according to an embodiment.

Referring to FIG. 2, the divider 110 may receive a codeword having a total code length of 16 bits, of which nine bits are information bits u5, u6, u7, u10, u11, u12, u13, u14, and u15, and remaining seven bits are frozen bits u0, u1, u2, u3, u4, u8, and u9. In addition, the divider 110 may generate a decoding tree that satisfies the received codeword as shown in FIG. 2. In this case, the divider 110 may divide the decoding tree generated based on a given division number (P) of 1 into one partition.

In order to divide the decoding tree into one partition, the divider 110 according to an embodiment may divide the decoding tree into one partition including all lowest nodes.

Figure 3:
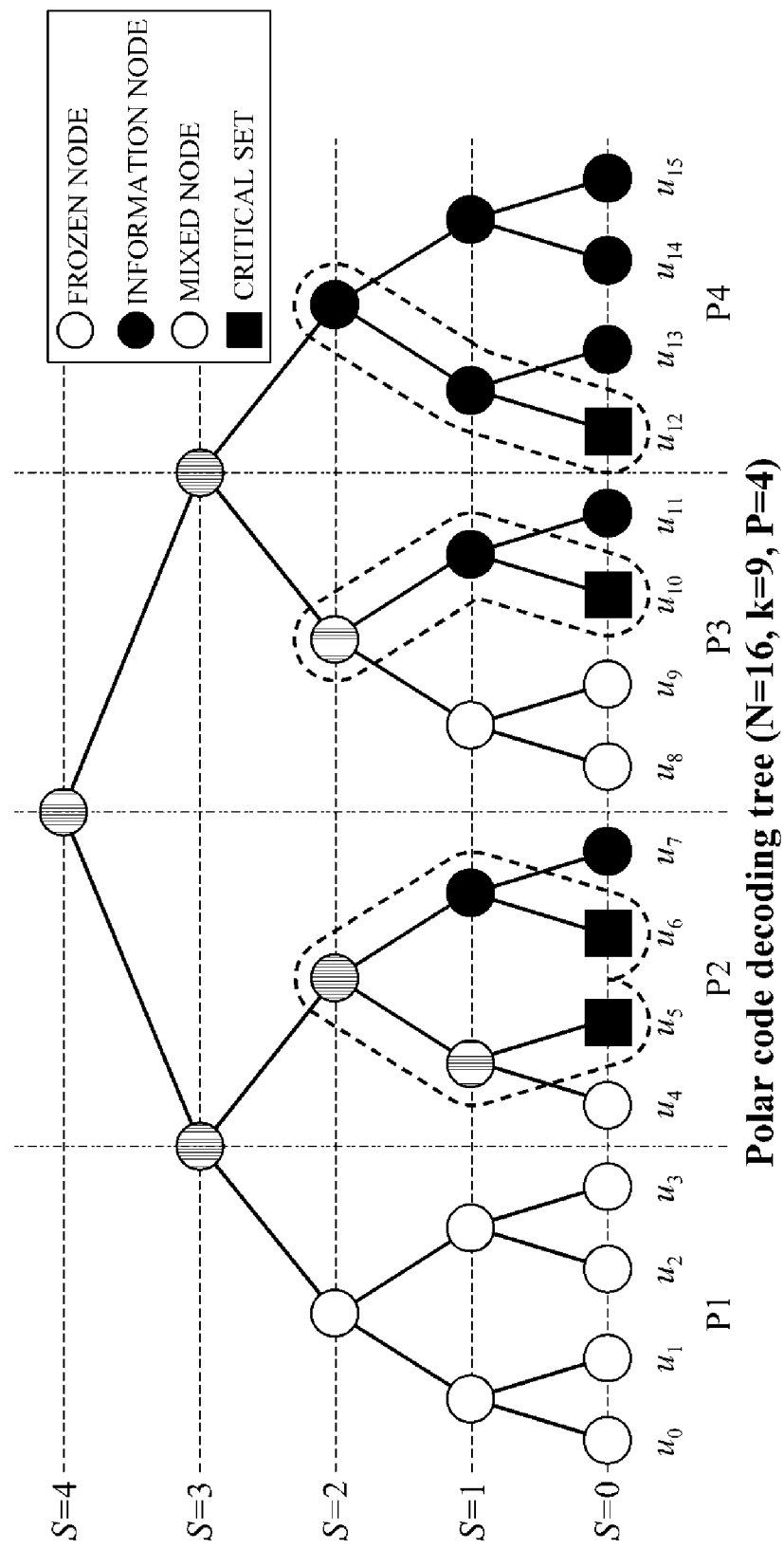
FIG. 3 is a diagram for describing a process in which a divider divides a decoding tree into a plurality of partitions according to an embodiment.

FIG. 3 is a diagram for describing a process in which the divider 110 divides a decoding tree into a plurality of partitions according to an embodiment.

Referring to FIG. 3, the divider 110 according to an embodiment may receive the codeword of FIG. 2 and divide the decoding tree into four partitions according to a given division number (P) of 4.

In other words, the divider 110 according to an embodiment may divide the decoding tree into four as shown in FIG. 3 such that each of four partitions P1, P2, P3, and P4 in the received 16-bit codeword equally includes four lowest nodes.

The determiner 120 may select a specific partition from among one or more partitions based on the number of critical sets included in each partition and determine a memory size for storing a primary decoding result based on the specific partition.

The determiner 120 according to an embodiment may select, from among the one or more partitions, a partition including most critical sets as the specific partition.

The determiner 120 according to an embodiment may determine the memory size for storing the primary decoding result based on the number of critical sets included in the specific partition.

Here, the critical set may refer to a set of first bits of nodes composed of only information bits. In other words, a set of bits with a high probability of occurrence of errors in the SC-Flip decoding process may be regarded as the critical set.

Referring to FIG. 3, a process of determining the size of the memory for storing the primary decoding result of the determiner 120 according to an embodiment may be confirmed.

For description, it is assumed in FIG. 3 that in the codeword, u5, u6, u10, and u12 are the critical sets.

The partitions P1, P2, P3, and P4 include 0, 2 (u5, u6), 1 (u10), and 1 (u12) critical sets, respectively. In this case, the determiner 120 according to an embodiment may select P2, the partition including most critical sets as the specific partition.

The decoder 130 may decode the codeword by using an SC-Flip decoding method.

Specifically, the decoder 130 primarily decodes the codeword by using the SC decoding technique.

That is, the decoder 130 may primarily decode the entire received codeword sequentially bit by bit based on the SC decoding technique.

In this case, the decoder 130 stores at least one of first information corresponding to a first bit of the critical sets and second information corresponding to a second bit of the critical sets in nodes of each of stages of a memory for storing the primary decoding result, as information for re-decoding.

In addition, when the CRC detection fails in the decoding process, the decoder 130 flips the bit with the smallest log likelihood ratio (LLR) value in the codeword, and performs re-decoding from the bit with the smallest log likelihood ratio value based on information for re-decoding.

Figure 4:
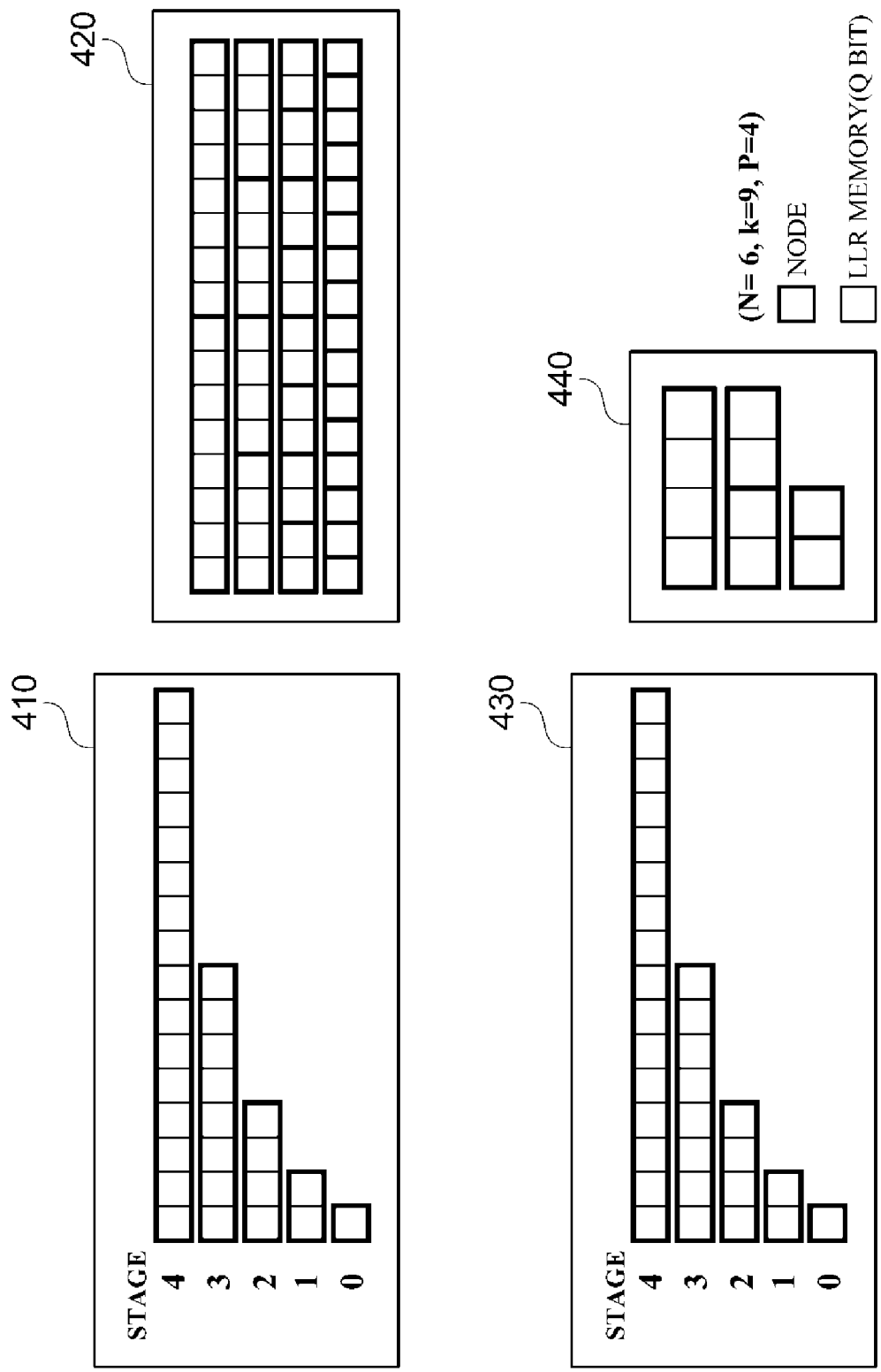
FIG. 4 is a diagram for comparing a memory of an SC-Flip decoding device in consideration of storing all primary decoding results and a memory of the polar code decoding apparatus according to an embodiment.

FIG. 4 is a diagram for comparing a memory of an SC-Flip decoding device in consideration of storing all primary decoding results and a memory of the polar code decoding apparatus 100 according to an embodiment.

Referring to FIG. 4, memories 410 and 420 of the SC-Flip decoding device in consideration of storing all primary decoding results when a codeword with a codeword length of 16 bits is decoded, and memories 430 and 440 of the polar code decoding apparatus 100 according to an embodiment may be described.

As shown in FIG. 4, the SC-Flip decoding device in consideration of storing all primary decoding results may include a memory 410 for performing SC decoding and a memory 420 for storing primary decoding results.

Meanwhile, taking it into account that the polar code decoding apparatus 100 according to an embodiment may be an SC-Flip-based decoding device, the polar code decoding apparatus 100 according to an embodiment may have the same structure as the memory structure of the SC-Flip decoding device considering the storage of all primary decoding results, as illustrated in FIG. 4.

Accordingly, the polar code decoding apparatus 100 according to an embodiment may include a memory 430 for performing SC decoding and a memory 440 for storing the primary decoding result as shown in FIG. 4.

The SC-Flip decoding method in consideration of storing all primary decoding results completes the primary decoding process by the SC decoding method. Then, when CRC detection fails, a bit with the smallest log likelihood ratio value is selected, the bit is flipped, and re-decoding is performed from the bit. However, when CRC detection still fails despite such re-decoding, a process is repeated in which a bit with the next smallest log likelihood ratio value is selected, the bit is flipped, recursive returning to the bit is performed, and re-decoding is performed from the bit by bit. At this time, the re-decoding is performed by calling up the primary decoding result, and thus in order to sequentially perform re-decoding from the bit again, the primary decoding result for all bits is required. Accordingly, the SC-Flip-based decoding device stores the primary decoding result and requires a memory for storing the primary decoding result.

That is, the SC-Flip decoding device in consideration of storing all primary decoding results has to store the primary decoding results of all bits including frozen bits in the memory 420 for storing the primary decoding result. Therefore, the memory 420 for storing the primary decoding result used in the SC-Flip decoding device in consideration of storing all primary decoding results has to have a size sufficient to store the primary decoding results for all received bits.

On the other hand, in the polar code decoding apparatus 100 according to an embodiment, the memory 440 for storing the primary decoding result may store only the primary decoding results for the critical sets.

That is, the decoder 130 according to an embodiment may select and store only the primary decoding results of some bits among all the received bits.

After all, the polar code decoding apparatus 100 according to an embodiment may perform the decoding process with a reduced size of the memories 430 and 440 as compared to the memories 410 and 420 used in the SC-Flip decoding device in consideration of storing all the primary decoding results.

Figure 5:
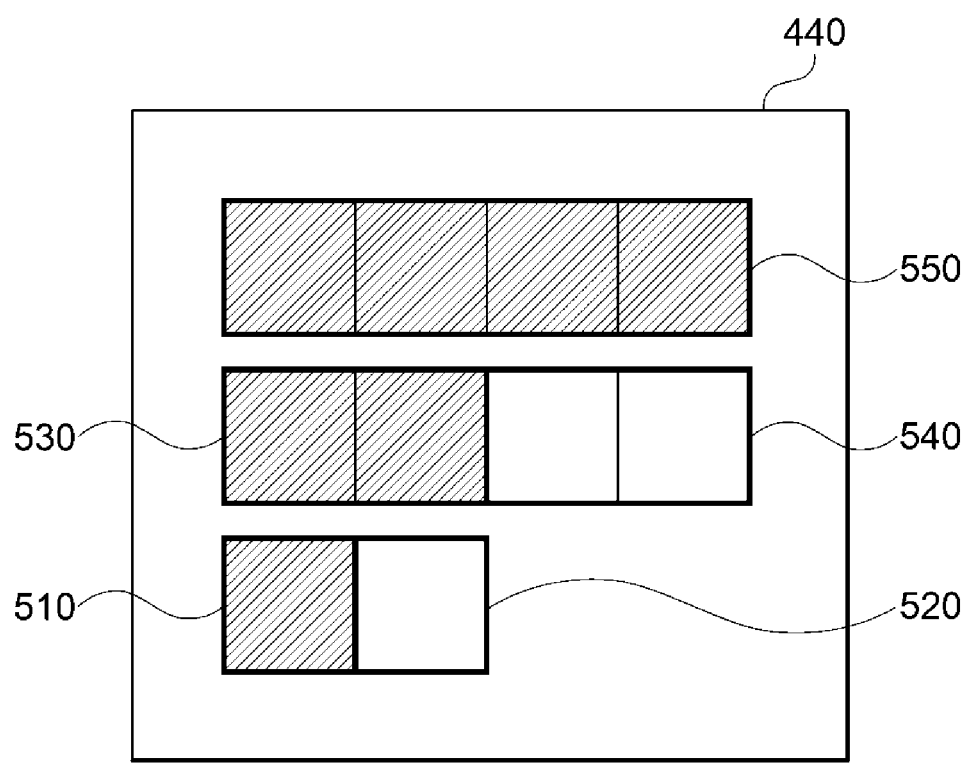
FIG. 5 is a diagram for describing a process of storing a primary decoding result of a decoder according to an embodiment.

FIG. 5 is a diagram for describing a process of storing the primary decoding result of the decoder 130 according to an embodiment.

Referring to FIG. 5, the decoder 130 uses the memory 440 for storing the primary decoding result of FIG. 4 under the condition of a code length (N) of 16 bits and a division number (P) of 4 to store the primary decoding result.

When CRC detection fails in the decoding process, the decoder 130 stores at least one of first information corresponding to a first bit of the critical sets and second information corresponding to a second bit of the critical sets in nodes of each of stages of a memory for storing the primary decoding result, as information for re-decoding.

In this case, the first bit may refer to a bit of the first critical set among one or more critical sets, and the second bit may refer to a bit of the second critical set.

In addition, the first information according to an embodiment may be state information about each of stages of the memory for performing successive cancellation decoding when the first bit is re-decoded, and the second information may be state information about each of the stages of the memory for performing the successive cancellation decoding when the second bit is re-decoded.

The decoder 130 according to an embodiment may store the first information in first nodes 510, 530, and 550 of their respective stages of the memory for storing the primary decoding result and may store the second information in second nodes 520 and 540 of their respective stages of the memory for storing the primary decoding result based on a result of performing a shift operation on each of the first bit and the second bit by selecting whether to store the second information.

In this case, the first shift operation according to an embodiment may be an operation of performing a right shift by as much as the stage of the memory for storing the primary decoding result in which the first information is to be stored, and the second shift operation may be an operation for performing a right shift by as much as the stage of the memory storing the primary decoding result in which the second information is to be stored.

The result of the shift operation may indicate whether the first bit and the second bit share the node. Specifically, when the result of the first shift operation is different from the result of the second shift operation, the first bit and the second bit may not share the same node.

Accordingly, the decoder 130 according to an embodiment may use the results of the shift operations and may store the second information in the second nodes 520 and 540 when the result of the first shift operation on the first bit is different from the result of the second shift operation on the second bit.

The decoder 130 according to an embodiment may store an accumulated value of the result of the first shift operation as the first information in the first nodes 510, 530, and 550 and an accumulated value of the result of the second shift operation as the second information in the second nodes 520 and 540, based on the result of the first shift operation and the result of the second shift operation.

Specifically, the decoder 130 according to an embodiment may store the accumulated value of the result of the first shift operation and the accumulated value of the result of the second shift operation by adding, to the first nodes 510, 530, and 550 and the second nodes 520 and 540, respectively, a preset first value when the result of the first shift operation and the result of the second shift operation are the same, and a preset second value when the result of the first shift operation and the result of the second shift operation are different.

In this case, the preset first value may be, for example, 0, and the preset second value may be 1.

The accumulated value of the result of the shift operation may correspond to a node block order for each stage of the memory for storing the primary decoding result of the critical set bits. After all, the decoder 130 according to an embodiment may identify the address value of the bit with the smallest log likelihood ratio value as the accumulated value of the result of the shift operation and perform re-decoding from the bit with the smallest log likelihood ratio value.

Figure 6:
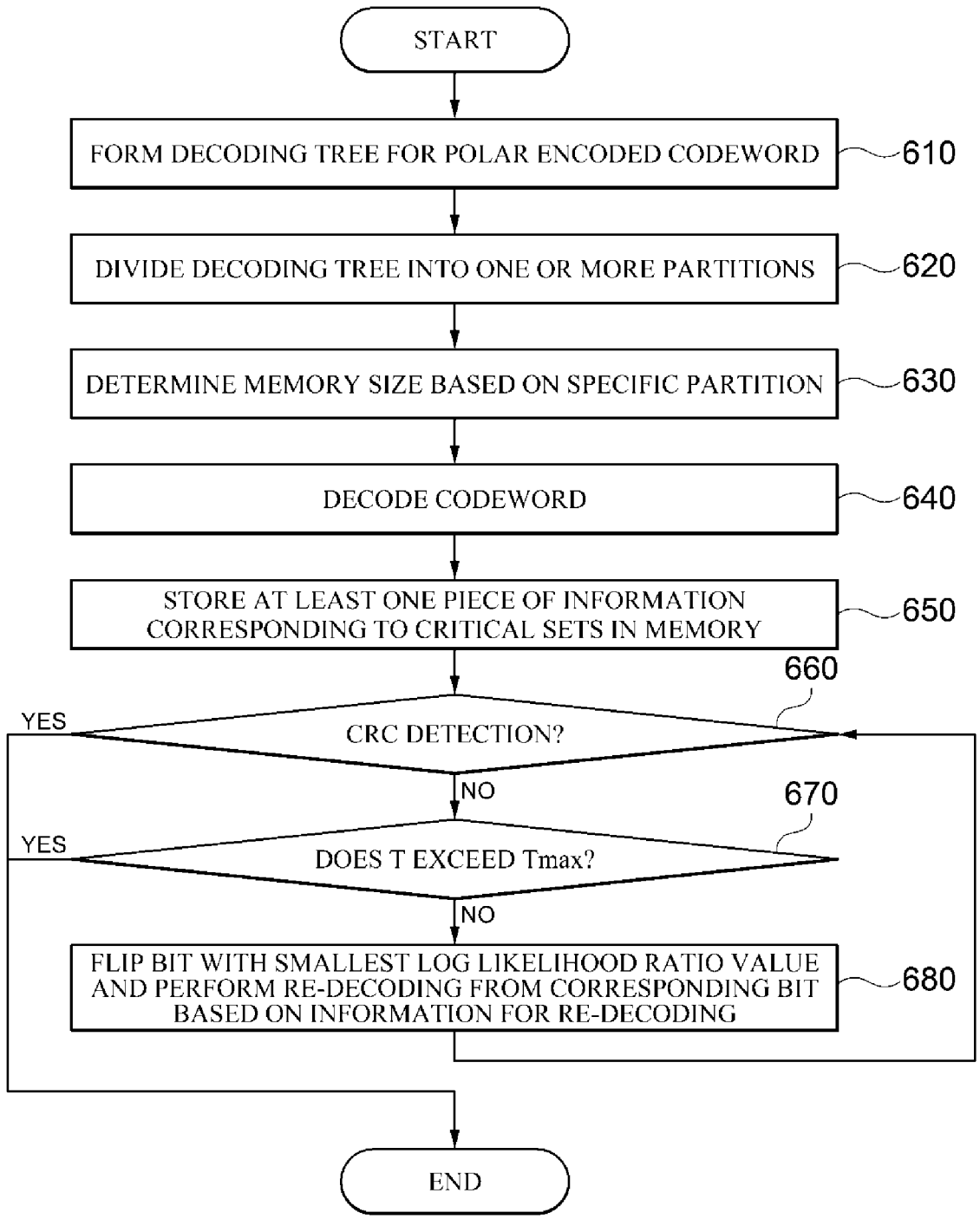
FIG. 6 is a flowchart for describing a method for decoding a polar code according to an embodiment.

FIG. 6 is a flowchart for describing a method for decoding a polar code according to an embodiment.

The method shown in FIG. 6 may be performed by the polar code decoding apparatus 100 shown in FIG. 1.

Referring to FIG. 6, the polar code decoding apparatus 100 generates a decoding tree in which a plurality of nodes including one or more critical sets for a polar-encoded codeword are formed in a hierarchical structure (610).

Then, the polar code decoding apparatus 100 divides the decoding tree into one or more partitions, where each partition equally includes lowest nodes of the decoding tree (620).

Then, the polar code decoding apparatus 100 selects a specific partition from among one or more partitions based on the number of critical sets included in each partition and determines a memory size for storing a primary decoding result to be used for re-decoding based on the specific partition (630).

Then, the polar code decoding apparatus 100 primarily decodes the codeword by using a successive cancellation (SC) decoding technique (640).

Then, the polar code decoding apparatus 100 stores at least one of first information corresponding to a first bit of the critical sets and second information corresponding to a second bit of the critical sets in nodes of each of stages of a memory for storing the primary decoding result, as information for re-decoding (650).

Then, the polar code decoding apparatus 100 determines whether CRC detection fails (660).

Then, when the polar code decoding apparatus 100 determines that the CRC detection fails, the polar code decoding apparatus 100 determines whether the number of bit flips T exceeds a preset limit number of bit flips Tmax (670).

In this case, when it is determined that the number of bit flips does not exceed the preset limit number of bit flips, the polar code decoding apparatus 100 flips a bit with the smallest log likelihood ratio value in the codeword, and performs re-decoding from the bit with the smallest log likelihood ratio value based on information for re-decoding (680).

Then, the polar code decoding apparatus 100 re-determines whether CRC detection fails again after performing re-decoding (660).

On the other hand, when the CRC detection fails even after the polar code decoding apparatus 100 performs the re-decoding, the polar code decoding apparatus 100 performs steps 670 and 680 again.

In FIG. 6 shown above, the method is divided into a plurality of steps; however, at least some of the steps may be performed in a different order, performed together in combination with other steps, omitted, performed in subdivided steps, or performed by adding one or more steps not illustrated.

Figure 7:
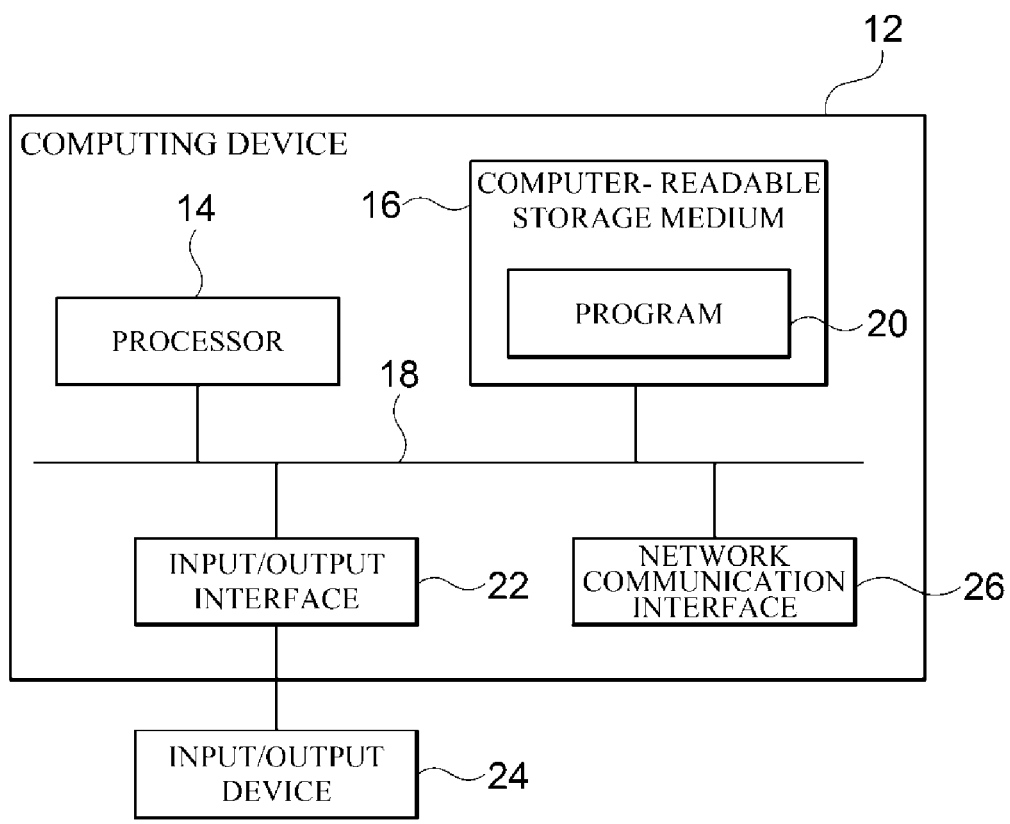
FIG. 7 is a block diagram for exemplarily illustrating a computing environment including a computing device according to an embodiment.

FIG. 7 is a block diagram for illustrating a computing environment 10 including a computing device 12 according to an embodiment. In the illustrated embodiment, respective components may have different functions and capabilities in addition to those described below, and additional components may be included in addition to those not described below.

The illustrated computing environment 10 includes a computing device 12. In an embodiment, the computing device 12 may be one or more components included in the polar code decoding apparatus 100.

The computing device 12 includes at least one processor 14, a computer-readable storage medium 16, and a communication bus 18. The processor 14 may cause the computing device 12 to operate according to the above-described exemplary embodiments. For example, the processor 14 may execute one or more programs stored in the computer-readable storage medium 16. The one or more programs may include one or more computer-executable instructions, which may be configured to cause, when executed by the processor 14, the computing device 12 to perform operations according to the exemplary embodiments.

The computer-readable storage medium 16 is configured to store computer-executable instructions or program codes, program data, and/or other suitable forms of information. A program 20 stored in the computer-readable storage medium 16 includes a set of instructions executable by the processor 14. In an embodiment, the computer-readable storage medium 16 may be a memory (a volatile memory such as a random access memory, a non-volatile memory, or any suitable combination thereof), one or more magnetic disk storage devices, optical disc storage devices, flash memory devices, other types of storage media that are accessible by the computing device 12 and may store desired information, or any suitable combination thereof.

The communication bus 18 interconnects various other components of the computing device 12, including the processor 14 and the computer-readable storage medium 16.

The computing device 12 may also include one or more input/output interfaces 22 that provide an interface for one or more input/output devices 24, and one or more network communication interfaces 26. The input/output interface 22 and the network communication interface 26 are connected to the communication bus 18. The input/output device 24 may be connected to other components of the computing device 12 via the input/output interface 22. The exemplary input/output device 24 may include a pointing device (a mouse, a trackpad, or the like), a keyboard, a touch input device (a touch pad, a touch screen, or the like), a voice or sound input device, input devices such as various types of sensor devices and/or imaging devices, and/or output devices such as a display device, a printer, an interlocutor, and/or a network card. The exemplary input/output device 24 may be included inside the computing device 12 as a component constituting the computing device 12, or may be connected to the computing device 12 as a separate device distinct from the computing device 12.

According to the disclosed embodiments, it is possible to prevent unnecessary memory from being included in a decoding apparatus and determine an efficient memory size required for decoding, by appropriately determining a memory size for storing the primary decoding result.

According to the disclosed embodiments, it is possible to reduce the amount of memory used in the decoding process compared to the related art by storing only the primary decoding result for the critical set.

Although the present disclosure has been described in detail through the representative embodiments as above, those skilled in the art will understand that various modifications can be made thereto without departing from the scope of the present disclosure. Therefore, the scope of rights of the present disclosure should not be limited to the described embodiments, but should be defined not only by the claims set forth below but also by equivalents of the claims.

What is claimed is:

1. A method of decoding a polar code, comprising:
generating a decoding tree in which a plurality of nodes including critical sets for a polar-encoded codeword are formed in a hierarchical structure, wherein the critical sets represent sets of bits having a probability of occurrence of errors among information bits of the polar-encoded codeword in a successive cancellation-flip (SCF) decoding process;
dividing the decoding tree into one or more partitions, each partition equally including lowest nodes of the decoding tree;
determining a memory size for storing a primary decoding result based on a number of critical sets included in a specific partition, the specific partition being selected from among the one or more partitions based on the number of critical sets included in each partition, wherein the primary decoding result includes information based on at least one of shift operation on bits of the critical sets included in the specific partition; and
decoding, based on the critical sets included in the specific partition, the polar-encoded codeword primarily by using a successive cancellation (SC) decoding technique,
wherein the decoding includes:
obtaining the primary decoding result by performing the decoding of the polar-encoded codeword;
storing at least one of first information corresponding to a first bit of the critical sets and second information corresponding to a second bit of the critical sets in nodes of each of stages of a memory, as information of the primary decoding result for re-decoding, and
performing a cyclic redundancy check (CRC) detection, wherein in the decoding, a bit with a lowest log likelihood ratio (LLR) value in the polar-encoded codeword is flipped based on the information for re-decoding and re-decoding is performed from the bit with the lowest log likelihood ratio value, when the cyclic redundancy check (CRC) detection fails.

2. The method of claim 1, wherein the determining of the memory size includes selecting, from among the one or more partitions, a partition including a largest number of the critical sets as the specific partition.

3. The method of claim 1, wherein the first information is state information about each of stages of the memory for performing successive cancellation decoding when the first bit is re-decoded, and the second information is state information about each of the stages of the memory for performing the successive cancellation decoding when the second bit is re-decoded.

4. The method of claim 1, wherein the decoding includes storing the first information in a first node of each of the stages of the memory for storing the primary decoding result and storing the second information in a second node of each of the stages of the memory for storing the primary decoding result based on a result of performing a shift operation on each of the first bit and the second bit.

5. The method of claim 4, wherein the decoding includes storing the second information in the second node when a result of a first shift operation on the first bit is different from a result of a second shift operation on the second bit.

6. The method of claim 5, wherein the first shift operation is an operation of performing a right shift by as much as the stage of the memory for storing the primary decoding result in which the first information is to be stored, and the second shift operation is an operation for performing a right shift by as much as the stage of the memory storing the primary decoding result in which the second information is to be stored.

7. The method of claim 5, wherein the decoding includes storing an accumulated value of the result of the first shift operation as the first information in the first node and an accumulated value of the result of the second shift operation as the second information in the second node, based on the result of the first shift operation and the result of the second shift operation.

8. The method of claim 7, wherein the decoding includes storing the accumulated value of the result of the first shift operation and the accumulated value of the result of the second shift operation by adding, to the first node and the second node, respectively, a preset first value when the result of the first shift operation and the result of the second shift operation are the same, and a preset second value when the result of the first shift operation and the result of the second shift operation are different.

9. A polar code decoding apparatus comprising:
a divider configured to generate a decoding tree in which a plurality of nodes including critical sets for a polar-encoded codeword are formed in a hierarchical structure, and divide the decoding tree into one or more partitions, each partition equally including lowest nodes of the decoding tree, wherein the critical sets represent sets of bits having a probability of occurrence of errors among information bits of the polar-encoded codeword in a successive cancellation-flip (SCF) decoding process;
a determiner configured to determine a memory size for storing a primary decoding result based on a number of critical sets included in a specific partition, the specific partition being selected from among the one or more partitions based on the number of critical sets included in each partition, wherein the primary decoding result includes information based on at least one of shift operation on bits of the critical sets included in the specific partition; and
a decoder configured to decode, based on the critical sets included in the specific partition, the polar-encoded codeword primarily by using a successive cancellation (SC) decoding technique,
wherein the decoder obtains the primary decoding result by performing the decoding of the polar-encoded codeword, stores at least one of first information corresponding to a first bit of the critical sets and second information corresponding to a second bit of the critical sets in nodes of each of stages of a memory, as information of the primary decoding result for re-decoding, and performs a cyclic redundancy check (CRC) detection, and
wherein a bit with a lowest log likelihood ratio (LLR) value in the polar-encoded codeword is flipped based on the information for re-decoding and re-decoding is performed from the bit with the lowest log likelihood ratio value, when the decoder fails the cyclic redundancy check (CRC) detection in the decoding.

10. The polar code decoding apparatus of claim 9, wherein the determiner selects, from among the one or more partitions, a partition including a largest number of the critical sets as the specific partition.

11. The polar code decoding apparatus of claim 9, wherein the first information is state information about each of stages of the memory for performing successive cancellation decoding when the first bit is re-decoded, and the second information is state information about each of the stages of the memory for performing the successive cancellation decoding when the second bit is re-decoded.

12. The polar code decoding apparatus of claim 9, wherein the decoder stores the first information in a first node of each of the stages of the memory for storing the primary decoding result and stores the second information in a second node of each of the stages of the memory for storing the primary decoding result based on a result of performing a shift operation on each of the first bit and the second bit.

13. The polar code decoding apparatus of claim 12, wherein the decoder stores the second information in the second node when a result of a first shift operation on the first bit is different from a result of a second shift operation on the second bit.

14. The polar code decoding apparatus of claim 13, wherein the first shift operation is an operation of performing a right shift by as much as the stage of the memory for storing the primary decoding result in which the first information is to be stored, and the second shift operation is an operation for performing a right shift by as much as the stage of the memory storing the primary decoding result in which the second information is to be stored.

15. The polar code decoding apparatus of claim 13, wherein the decoder stores an accumulated value of the result of the first shift operation as the first information in the first node and an accumulated value of the result of the second shift operation as the second information in the second node, based on the result of the first shift operation and the result of the second shift operation.

16. The polar code decoding apparatus of claim 15, wherein the decoder stores the accumulated value of the result of the first shift operation and the accumulated value of the result of the second shift operation by adding, to the first node and the second node, respectively, a preset first value when the result of the first shift operation and the result of the second shift operation are the same, and a preset second value when the result of the first shift operation and the result of the second shift operation are different.

* * * * *